(12) United States Patent
Kitsukawa et al.

(10) Patent No.: US 6,504,770 B2
(45) Date of Patent: *Jan. 7, 2003

(54) SEMICONDUCTOR MEMORY

(75) Inventors: Goro Kitsukawa, Kisarazu (JP); Toshitsugu Ueda, Ome (JP); Manabu Ishimatsu, Fukuoka (JP); Michihiro Mishima, Kunitachi (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/067,231

(22) Filed: Feb. 7, 2002

(65) Prior Publication Data

US 2002/0071324 A1 Jun. 13, 2002

Related U.S. Application Data

(63) Continuation of application No. 09/716,252, filed on Nov. 21, 2000, now Pat. No. 6,407,952, which is a continuation of application No. 09/445,964, filed on Dec. 16, 1999, now Pat. No. 6,191,983.

(30) Foreign Application Priority Data

Jun. 19, 1997 (JP) ............................................. 9-162679

(51) Int. Cl.[7] .................................................. G11C 7/00
(52) U.S. Cl. ............................ 365/200; 365/51; 365/63

(58) Field of Search .......................... 365/200, 63, 72, 365/230.06, 51

(56) References Cited

U.S. PATENT DOCUMENTS

| 5,615,156 A | 3/1997 | Yoshida et al. ............. 365/200 |
| 5,673,227 A | 9/1997 | Engles et al. ............... 365/200 |
| 5,841,961 A | 11/1998 | Kozaru et al. .............. 365/200 |

FOREIGN PATENT DOCUMENTS

| JP | 6-76594 | 3/1994 |
| JP | 8-55494 | 2/1996 |
| JP | 8-153399 | 6/1996 |
| JP | 8-255552 | 8/1996 |

*Primary Examiner*—Tan T. Nguyen
(74) *Attorney, Agent, or Firm*—Antonelli, Terry, Stout & Kraus, LLP

(57) ABSTRACT

There is provided a semiconductor memory which allows a redundant memory cell to be disposed at the center while maintaining the continuity of layout units of direct peripheral circuits and allows the total yield of the memory cell and the direct peripheral circuits to be improved. The inventive semiconductor memory is a 64 M-bits or 256 M-bits DRAM using a hierarchical word line structure or a multi-division bit line structure and comprises a main row decoder region, a main word driver region, a column decoder region, a peripheral circuit/bonding pad region, a memory cell array, a sense amplifier region, a sub-word driver region, intersection regions and the like formed on one semiconductor chip.

2 Claims, 10 Drawing Sheets

(a)

(a)

COLUMN REDUNDANT CELL

WORD REDUNDANT CELL (b)

SEMICONDUCTOR MEMORY

CROSS-REFERENCE TO RELATED APPLICATION

This is a continuation of application Ser. No. 09/716,252, filed Nov. 21, 2000 (now U.S. Pat. No. 6,407,952); which is a continuation of application Ser. No. 09/445,964, filed Dec. 16, 1999 (now U.S. Pat. No. 6,191,983) the entire disclosures of which are hereby incorporated by reference.

BACKGROUND OF THE INVENTION

1. Field of the Invention

The present invention relates to a technology of highly integrated semiconductor memory, and more specifically, to a technology effectively applied to the disposition of a redundant memory cell, and to a layout method of word drivers and sense amplifiers connected to the redundant memory cell.

2. Description of the Related Art

In the field of highly integrated semiconductor memories examined by the inventor, the technology for having a small number of redundant memory cells in addition to normal memory cells, and for switching access to the redundant memory cell when the normal memory cell is defective is widely used in order to improve the production yield.

As for the semiconductor memory having the redundant memory cells in addition to the normal memory cells as described above, there is, for example, the technology described in Japanese Patent Publication No. 2555252 entitled "Semiconductor Memory Device," for example. According to this technology, column redundancy is implemented by having a normal memory cell array and a redundant memory cell array in which a plurality of normal memory cell array blocks and a plurality of redundant memory cell array blocks are controlled in common by respective column decoders.

Having noticed on the high integration of the semiconductor memory having the redundant memory cells in addition to the normal memory cells as described above, the inventor examined the disposition of the redundant memory cell and the layout method of the word drivers and sense amplifiers connected to the redundant memory cell. The contents examined by the inventor will be explained below with reference FIG. 10.

FIG. 10 shows the disposition of the redundant memory cell. This redundant memory cell is positioned at the peripheral part of a normal memory cell array 15, as shown in FIG. 10(a). Further, sense amplifier regions 16, sub-word driver regions 17, and their intersection regions 18 are disposed adjacent to and around the memory cell array 15, as shown in FIG. 10(b).

Additionally, with the high integration of the semiconductor memory, while the plane size of the memory cell may be refined further by forming it in 3D, direct peripheral circuits such as the word drivers and sense amplifiers connected with the memory cell must be reduced in the plane direction in correspondence with the memory cell. However, their layout is not easy because they are different from the memory cell and cannot be formed in 3-D Then, as a countermeasure thereof, a method has been widely used of reducing an occupied area by sharing contacts, through holes, power sources and signal lines in a plurality of units of those circuits in a repeating pitch in which a plurality of memory cells are put together. For instance, this method has been applied in the layout unit of word drivers corresponding to 16 word lines W, and in the layout unit of sense amplifiers corresponding to 16 bit lin6s BL.

Meanwhile, along with the high integration of the memory, the yield of the redundant memory cell has also become a problem. In this case, the redundant memory cell is disposed at the center of an array where the manufacturing condition is stable. Because its test before setting a fuse may be eliminated or may be simplified if the redundant memory cell is surely alive, the whole test time may be shortened.

However, it has been difficult to lay out only the sub-word drivers or sense amplifiers related to the redundant memory cell especially because the number of word lines or bit lines of the redundant memory cell is smaller than the layout units. This is because the layout unit is too small that the contacts, through holes, power sources and signal lines cannot be shared as described above. Further, there has been the possibility that the characteristics and yield of the sub-word drivers or sense amplifiers for the redundant memory cell become abnormal if the repeated shapes are different.

SUMMARY OF THE INVENTION

Accordingly, it is an object of the present invention to provide a semiconductor memory which allows a redundant memory cell to be disposed at the center while maintaining the continuity of the layout units of direct peripheral circuits, and allows the total yield of the memory cell and the direct peripheral circuits to be improved by an efficient layout method of sub-word drivers and sense amplifiers for disposing the redundant memory cell at the center of a memory cell array.

The above-mentioned and other objects and the novel characteristics of the invention will be apparent from the following description and the accompanying drawings.

The summary of a typical example of the inventions disclosed in the present specification will explained below briefly.

A semiconductor memory is arranged in accordance with the present invention such that even if a redundant memory cell is disposed at the center of a memory cell array, the same layout unit with the normal memory cell is used for the layout of sub-word drivers and sense amplifiers, and the sub-word drivers and sense amplifiers which are increased due to the redundant memory cell are adjusted by a related circuit of the normal memory. cell at the end of the memory cell array while maintaining the same repetition. Further, the changing point of the redundant memory cell and the normal memory cell is realized by replacing a control signal of the sub-word drivers and sense amplifiers.

This method allows the redundant memory cell to be disposed at the center while maintaining the continuity of the layout units of the direct peripheral circuits, and the general yield of the memory cells and direct peripheral circuits is improved. Further, it allows the defective occurrence rate to be reduced and the quality of the redundant memory cell to be improved, as compared to the case of disposing the redundant memory cell at the peripheral part.

The effects obtained by a typical example of the inventions disclosed in the present specification will be explained below briefly.

(1) The quality of the redundant memory cell may be improved in the manufacturing process of the semiconductor memory by disposing the redundant memory cell approximately at the center of the word line and bit line directions of the memory cell-array;

(2) The production yield of the memory cells and direct peripheral circuits may be improved because it is possible to maintain the normal repetition of the layouts of the direct peripheral circuits, such as the sub-word drivers and sense amplifiers adjacent to the memory cell, even when the redundant memory cell is disposed at the center; and (3) The general yield in the layout of the highly integrated semiconductor memory may be improved and the total chip cost may be reduced, including testing time by the effects (1) and (2).

The above-mentioned and other objects and the novel characteristics of the invention will be apparent from the following description and the accompanying drawings.

BRIEF DESCRIPTION OF THE DRAWINGS

FIGS. 6 through 8(a) and 8(b) are respectively, a circuit diagram, a plan view and a section view showing the sub-word driver;

DESCRIPTION OF THE PREFERRED EMBODIMENTS

Figure 1:
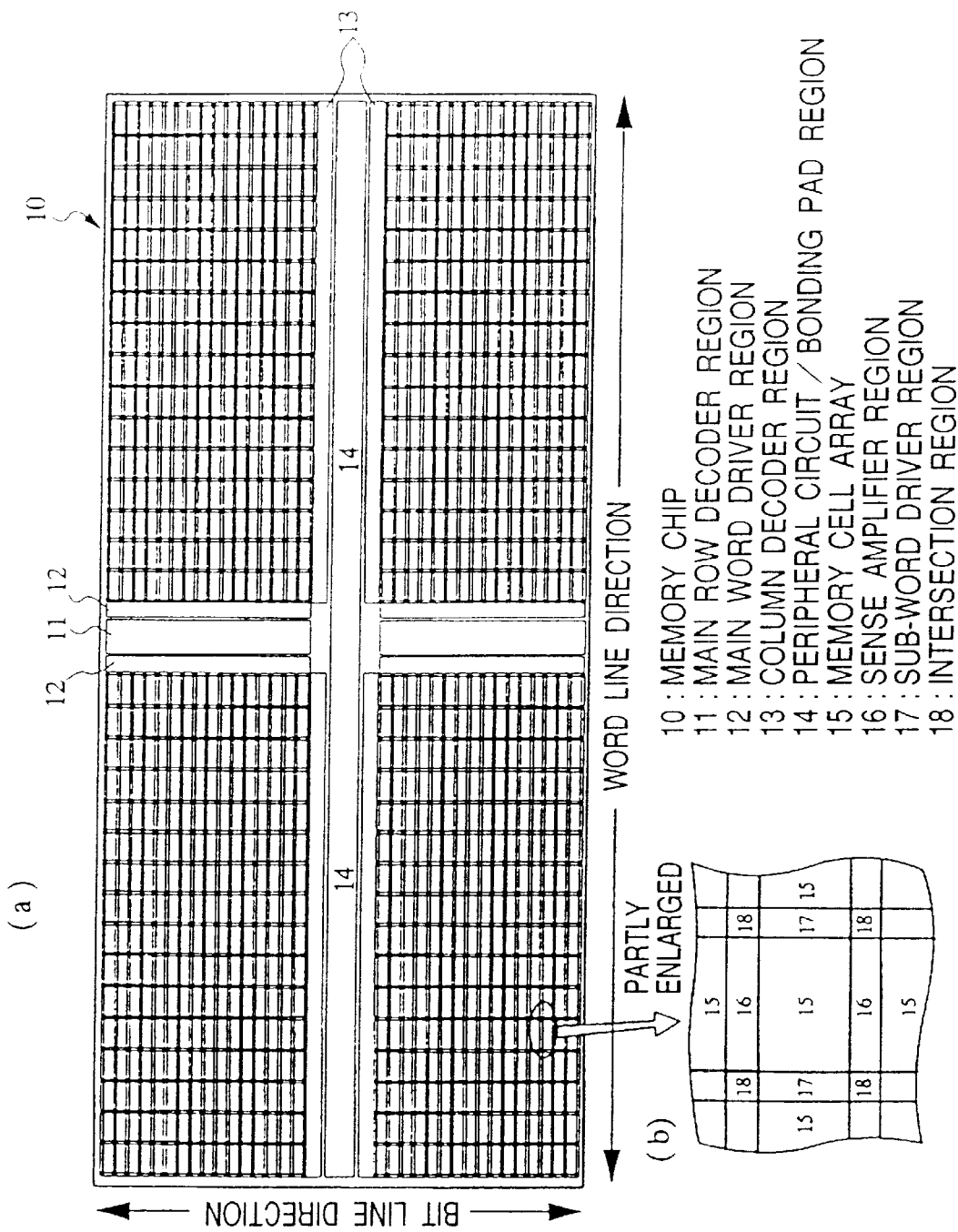
FIGS. 1(a) and 1(b) are respectively a layout and a partially enlarged view thereof showing a semiconductor memory according to one embodiment of the invention.

A preferred embodiment of the invention will be explained below in detail with reference to the drawings It is noted that the same components are denoted by the same reference numerals throughout the drawings for explaining the embodiment, and a repeated explanation thereof will be omitted.

First, the configuration of a semiconductor memory of the present embodiment will be explained with reference to FIG. 1.

The semiconductor memory of the present embodiment is a 64 M-bit or a 256 M-bit DRAM using a hierarchical word line structure or a multi-division bit line structure. Main row decoder regions 11, main word driver regions 12, column decoder regions 13, peripheral circuit/bonding pad regions 14, memory cell arrays 15, sense amplifier regions 16, sub-word driver regions 17, intersection regions 18 and the like are formed on a memory chip 10, for example, on one semiconductor chip, by the known semiconductor manufacturing technology. In FIG. 1, the horizontal direction is the row direction (word line direction), and the vertical direction is the column direction (bit line direction).

In the DRAM, memory regions comprising the memory cell array 15 and others are disposed divisionally at the left and right sides in the row direction and at the upper and lower sides in the column direction of the memory chip 10, as shown in FIG. 1. The memory regions disposed on the left and right sides are disposed in a pair interposing the main row decoder region 11 disposed at the center therebetween via the main word driver regions 12 disposed corresponding to the respective memory regions. The column decoder regions 13 which are disposed corresponding to the respective memory regions are disposed at the center of the upper and lower memory regions. Provided further at the center thereof as the peripheral circuit/bonding pad region 14 are: a row address buffer, a column address buffer, a pre-decoder, a timing generating circuit and a data input/output circuit, as well as a bonding pad for connecting with the external devices.

In the memory region, the sense amplifier region 16 is disposed in the column direction of the memory cell array 15, and the sub-word driver region 17 is disposed in the row direction. An FX driver (for driving the sub-word driver) and a control circuit (switch MOS transistor or the like) of the sense amplifier group are also disposed at the intersection region 18 of the sense amplifier region 16 and the sub-word driver region 17 (See FIG. 2). The word line is set in the row direction and the bit line in the column direction, with respect to the memory cell array 15. It is apparent that the invention may be applied when they are disposed in the opposite way.

Specifically, in the semiconductor memory of the present embodiment, main word lines and pre-decoder lines (FXB lines) for controlling the sub-word drivers are outputted to the right and left from the main row decoder region 11 and from the main word driver region 12 at the center of the long edge. The peripheral circuit/bonding pad region 14 is disposed at the center of the short edge, and the column decoder regions 13 are disposed between the peripheral circuit/bonding pad region 14 and the memory region. A column selection signal line YS controls a large number of sense amplifiers in the upper or lower memory region. A redundant memory cell is disposed approximately at the center of one memory cell array 15. It is possible to provide such a redundant memory dell in all of the memory cell arrays 15, or to provide it for every other memory cell array or for one out of several memory cell arrays. The number of the redundant memory cells is determined by a trade-off between the yield and the chip area.

Figure 2:
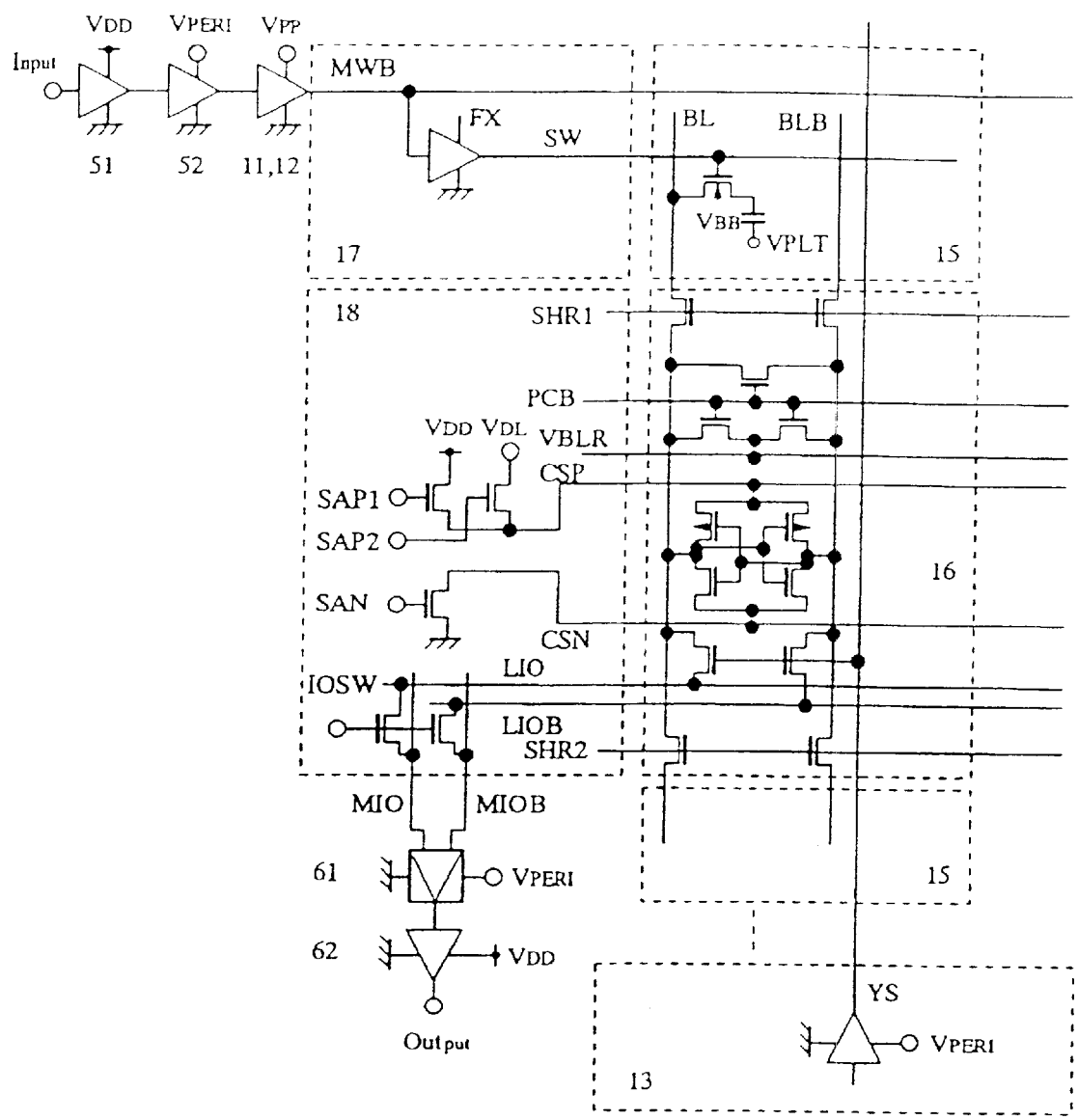
FIG. 2 is a circuit diagram showing a memory cell array and its peripheral circuits in the semiconductor memory of the embodiment.

FIG. 2 is a circuit diagram simplifying the memory cell array 15 and its peripheral circuits, and shows the circuits contained in each region, such as the main row decoder region 11, the main word driver region 12, the column decoder region 13, the memory cell array 15, the sense amplifier region 16, the sub-word driver region 17, the intersection region 18, and others, as well as an input circuit 51, a pre-decoder 52, a main amplifier 61, an output circuit 62 and others.

The memory cell array 15 comprises a plurality of memory cells of 64 K-bits in a pair of 256 sub-word lines×256 bit lines, for example, arrayed two dimensionally. A main word line MWB (B is an inversive denotation of MW. The same applies to other signal lines) and a sub-word line SW are disposed in the horizontal direction, and bit lines BL and BLB and the column selecting signal line YS are disposed in the vertical direction. The hierarchical word line scheme is adopted for the word line structure, and the two sub-array shared scheme is adopted for the sense amplifier. An over-drive scheme, for example, the scheme of driving the sense amplifier driving line CSP at a voltage level of VDD at first and then at a voltage level of VDL later, is adopted to quicken the speed.

These are known technologies discussed in IEEE Journal of SolidState Circuit, Vol. 31, No. 9, Sept. 1996, "A 29-ns 64 Mb DRAM with Hierarchical Array Architecture".

The sub-word driver regions 17 are disposed adjacent to and on the right and left of the memory cell array 15. Inputs to the sub-word driver are the main word line MWB and the pre-decoder line FX, and its output is the sub-word line SW. Sense amplifier drivers (although three NMOS transistors are shown in the figure, PMOS transistors may be used on the charge side) and a switch transistor IOSW of local Io lines LIO and LIOB and main IO lines MIO and MIOB are provided in the intersection region 18 of the sense amplifier region 16 and the sub-word driver region 17 as shown in the figure.

Further, although not shown in the figure, precharge circuits and FX drivers, such as sense amplifier driving lines CSP and CSN, local Io lines LIO and LIOB and main Io lines MIO and MIOB, may be disposed in order to further enhance the performance. Other than those, the input circuit 51, the pre-decoder 52, the main word driver, the column decoder, the main amplifier 61, and the output circuit 62 are shown in FIG. 2. Further, in the figure, the reference symbols SHR1 and SHR2 denote shared sense amplifier isolating signal lines, SAPI and SAP2 denote sense amplifier charging 12 signal lines, and SAN denotes a sense amplifier discharging signal line.

Further, an internal step-down scheme is used to lower power consumption and to enhance the reliability of microdevices and voltage VPERI (2–5 V) which is lower than the power voltage VDD (3.3 V) that is used for the peripheral circuits, and voltage VDL (2.0 V) which is also lower than the power voltage that is used as memory cell storage voltage. It is noted that an input/output circuit uses the voltage VDD to interface with the outside. As is well known, voltage VPP boosted by a charge pumping operation is necessary as selection voltage of the sub-word line SW in order to write voltage VDL to the memory cell. Then, the voltage VPP is supplied as the operating voltage of the main word driver and the sub-word driver. Plate voltage VPLT and bit line pre-charge voltage VBLR supply 1.0 V, which is a half of the voltage VDL. Substrate voltage VBB is –1.0 V.

This hierarchical word line structure allows the pitch of the metal lines of the main word lines (MW and MWB) and the pre-decoder lines (FX and FXB) to relax more than that of the memory cell, and allows the production yield of the metal lines to be enhanced by providing a hierachy of the word lines to the main word lines and the sub-word lines SW, and by sharing a set of main word lines among a plurality of sub-word lines SW.

In this hierarchical word line structure, the sub-word lines SW lined up in the row direction are outputs of the sub-word drivers, and the main word lines MW and MWB outputted from the main word driver, as well as the pre-decoder lines FX and FXB outputted from the pre-decoder line FX driver, are inputted to the sub-word drivers to implement logical operations. A specific sub-word driver outputs High level voltage to the sub-word line SW to start the reading and writing operations of all memory cells connected to the sub-word line SW when the main word lines MW and MWB, for example, its input, and the pre-decoder lines FX and FXB in the column direction are selected.

During the reading operation, an arbitrary memory cell within the memory cell array 15 is designated by selecting the sub-word line SW by the sub-word driver and by selecting the bit lines BL and BLB by the column decoder. The data of this memory cell is amplified by the sense amplifier and is then read by the local Io lines LIO and LIOB and the main IO lines MIO and MIOB to be outputted from the output circuit 62 via the main amplifier 61. During the writing operation, an arbitrary memory cell is designated by the sub-word line SW and the bit lines BL and BLB in the same manner, and data may be written from a writing circuit (provided in parallel with the main amplifier 61, not shown in FIG. 2).

FIGS. 3(a), 3(b) and 3(c) are layouts showing the basic structure of the memory cell array 15, the direct peripheral circuits of the sense amplifier region 16, and the sub-word driver region 17 adjacent to the memory cell array 15 of the present embodiment.

As for the memory cell array 15, a word redundant memory cell is disposed approximately at the center in the word line W direction, and a column redundant memory cell is disposed approximately at the center in the bit line BL direction with respect to the normal memory cell, as shown in FIG. 3(a). Thereby, the quality of the redundant memory cell is improved, as compared to the case when the redundant memory cell is disposed at the peripheral part. When the redundant memory cell is disposed at the center, the dispositions of the sub-word driver SWD in the sub-word driver region 17 and the sense amplifier SA in the sense amplifier region 16 are contrived specifically.

For instance, in the case of the sub-word driver SWD, the repeating unit is fixed even at the center part where there is the redundant memory cell, as shown in FIG. 3b, and the sub-word driver SWD is increased by the redundant memory cell by adding a layout having a size smaller than the repeating unit, for example, a half, at the end of the memory cell array 15. In the figure, the repeating unit of the normal sub-word driver cell combined with the redundant sub-word driver cell at the center is equal to the neighboring repeating units. The additional cell exists for the normal sub-word driver cell and its boundary structure is the same as the others. End processing cells are disposed at the both ends.

As for the sense amplifier SA, the repeating unit of the normal sense amplifier cell combined with the redundant sense amplifier cell is disposed at the center, neighboring with the repeating units of only the normal sense amplifiers as shown in FIG. 3(c), similarly to the sub-word driver SWD and an additional cell whose size is half that of the normal sense amplifier cell is disposed at the end of the memory cell array 15. End processing cells are also disposed at both ends. Thus, the direct peripheral circuits (sub-word driver SWD and sense amplifier SA) connected to the redundant memory cells may be realized within the same repetition without making a special layout.

FIGS. 4(a) and 4(b) are layouts showing the units of repetition of the direct peripheral circuits of the sub-word driver and the sense amplifier, wherein FIG. 4b shows the repeating method according to the embodiment of the invention, and FIG. 4(a) shows a comparative example corresponding to that.

Here, Unit 1 is a repeating unit of 16 repetitions. Unit 2 is a layout unit smaller than Unit 1 and is used only once within the memory cell array 15. The reference symbol (N) denotes a normal memory cell related circuit, and (R) denotes a redundant memory cell related circuit. The end processing cells are necessary in either case to add half of the contacts for a feed well and to connect wires.

It is presumed in these two layouts that the redundant memory cell is disposed at the center of the memory cell array 15. in the comparative case in FIG. 4(a), Unit 1 is a layout of the normal memory cell related circuit. Unit 2 is a layout of the redundant memory cell related circuit. It is difficult to lay out Unit 2 so as to cut into the repetition of Unit 1. It is because the scale of Unit 2 is too small that the efficient layout cannot be made by sharing the parts.

Contrary to that, the increase of the circuit due to the redundant memory cell is managed by providing the Unit 2 at the end while maintaining the repetition of Unit 1 including the redundant memory cell in the present embodiment, as shown in FIG. 4(b). Unit 2 located at the end has the same shape at the boundaries with Unit 1. One half of Unit 1 of #9 at the center is used for the redundant cell, and the other half thereof is used for the normal cell.

Figure 3:
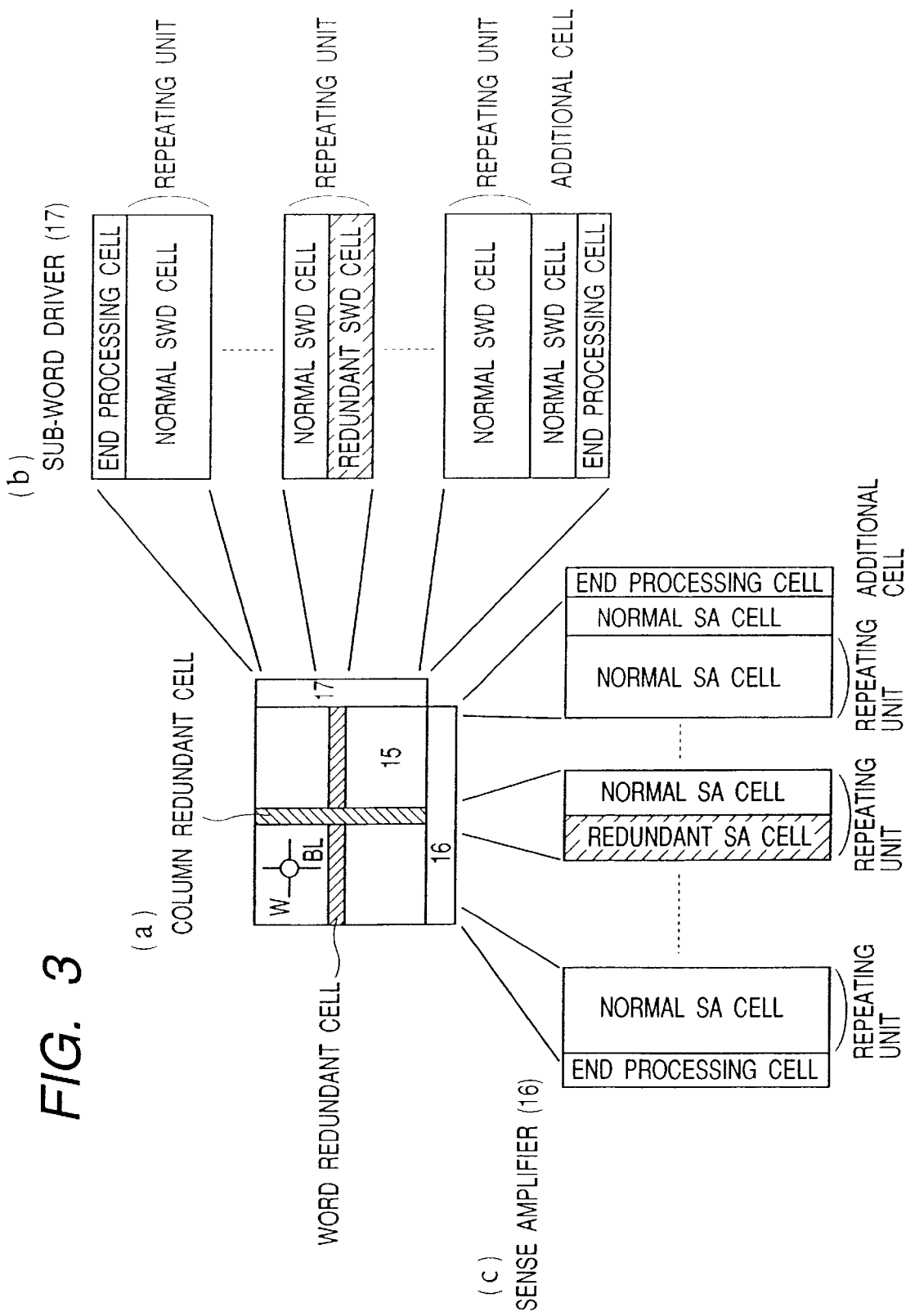
FIGS. 3(a), 3(b) and 3(c) are layouts showing the memory cell array and the direct peripheral circuits.
Figure 4:
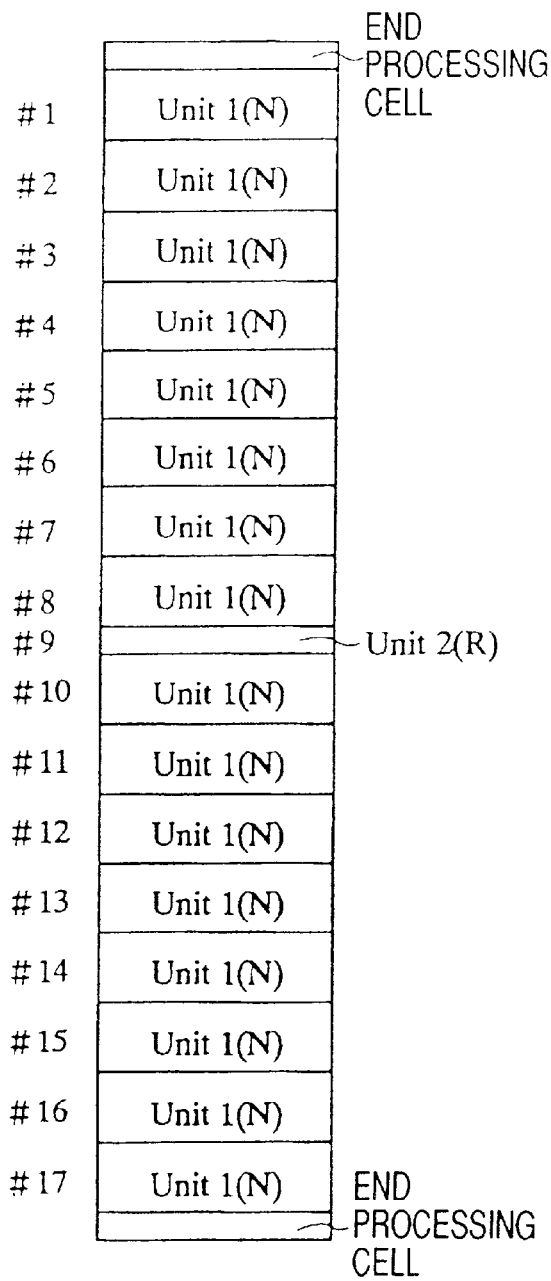
FIGS. 4(a) and 4(b) are layouts showing the comparison of repeating units of the direct peripheral circuits.
Figure 4:
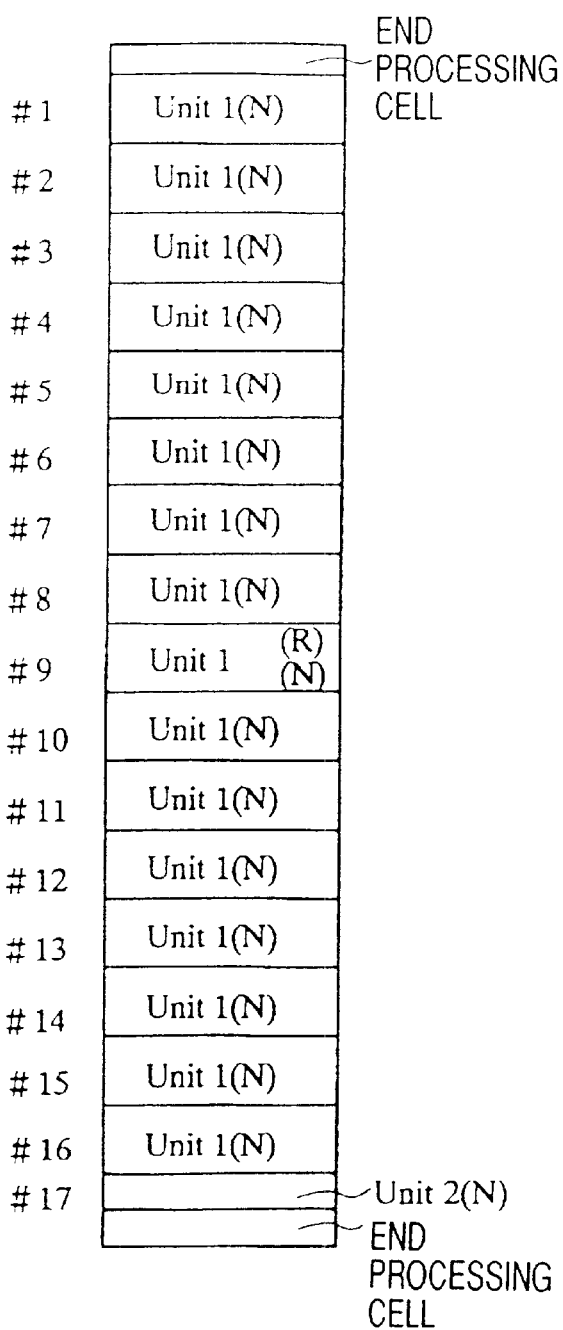
Figure 5:
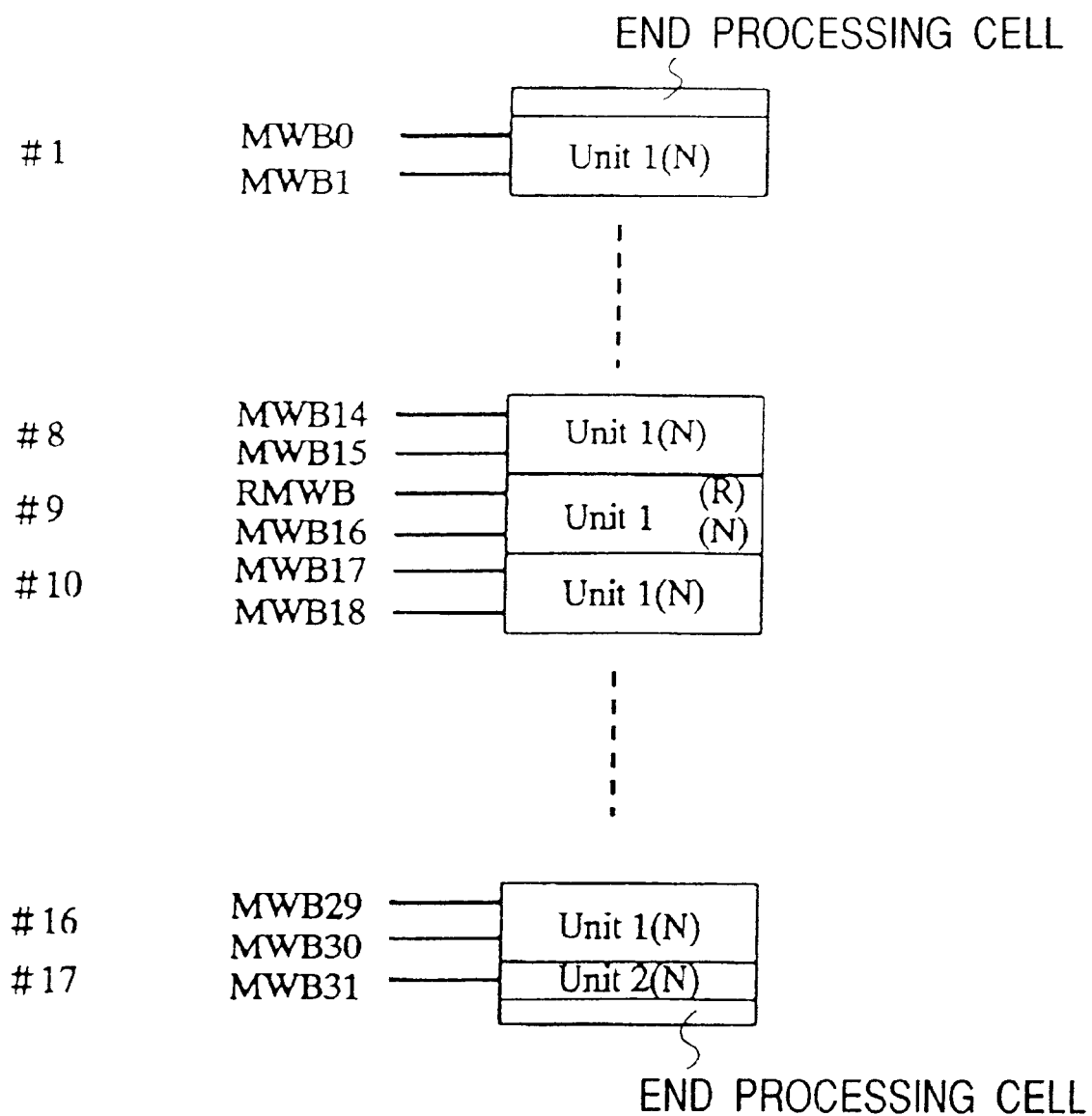
FIG. 5 is an explanatory diagram showing a layout method of sub-word drivers.

FIG. 5 is an embodiment in which the concept of the present invention, shown in FIG. 3 and FIG. 4, are applied to the layout of a sub-word driver.

Suppose that the memory cell array 15 has 256 normal sub-word lines and 8 redundant sub-word lines. one sub-word driver implements logical processing by one main word line MWB and one of eight pre-decoder lines not shown, and outputs one sub-word line. Unit 1 of the layout unit of this sub-word driver is a circuit which inputs two of the main word lines MWB 0 and 1, implements logical processing with four pre-decoder lines, and outputs four sub-word lines.

Unit 2 is a circuit which inputs one of the main word lines MWB, implements logical processing with four pre-decoder line, and outputs eight sub-word lines.

However, Unit 1 may be laid out in a width of 16 word lines, and Unit 2 may be laid out in a width of 8 word lines of the memory cell. This is because the sub-word lines are disposed alternately on the memory cell array 15 from the two sub-word driver regions 17 adjacent to the memory cell array 15.

The redundant main word line RMWB and the normal main word line MWB 16 are inputted into Unit 1 of #9. It is different from the other Unit 1 in that one normal main word line MWB among two lines is replaced with the redundant main word line RMWB. Unit 2 of #17 inputs the normal main word line MWB 31 and outputs four normal sub-word lines. The layout structure of the boundary between Unit 1 of #16 and Unit 2 of #17 is the same as the normal boundary layout between the Units 1.

Figure 6:
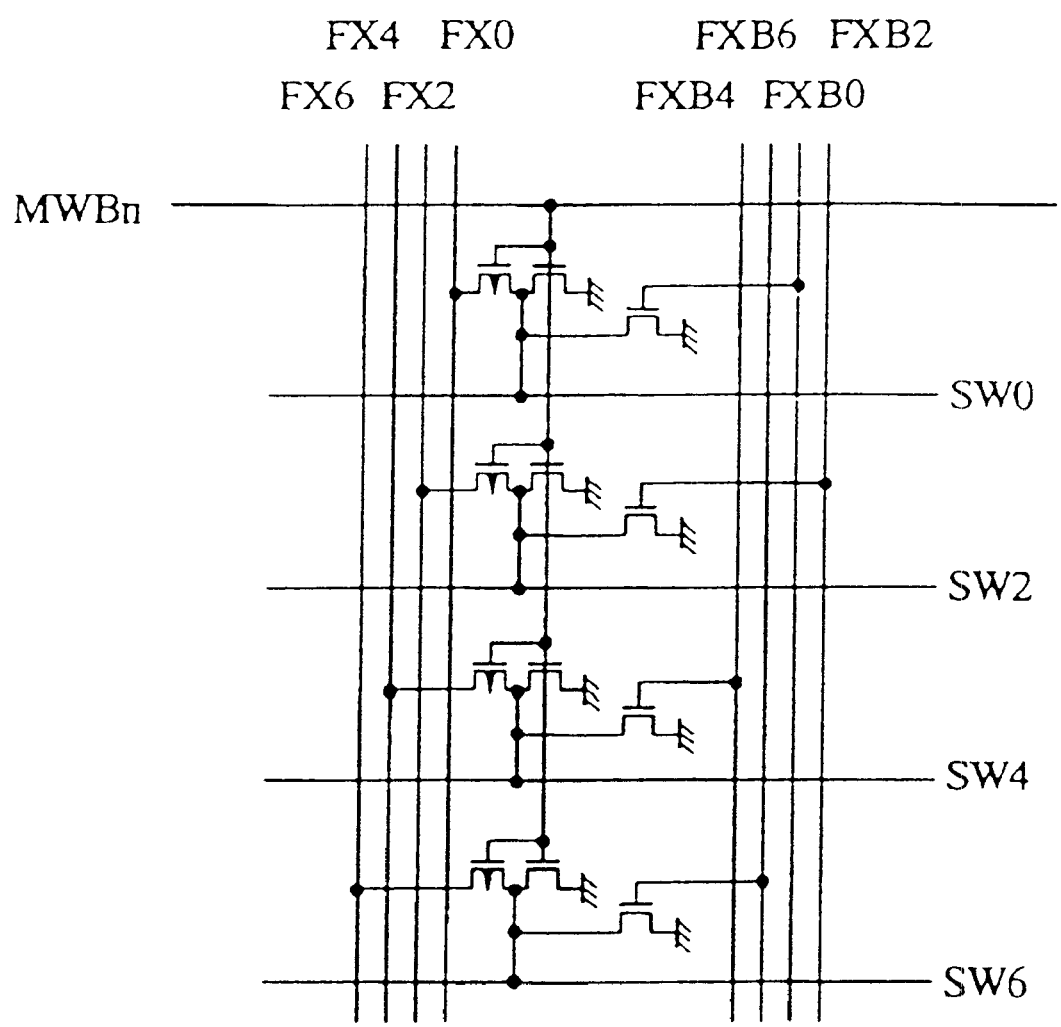
Figure 7:
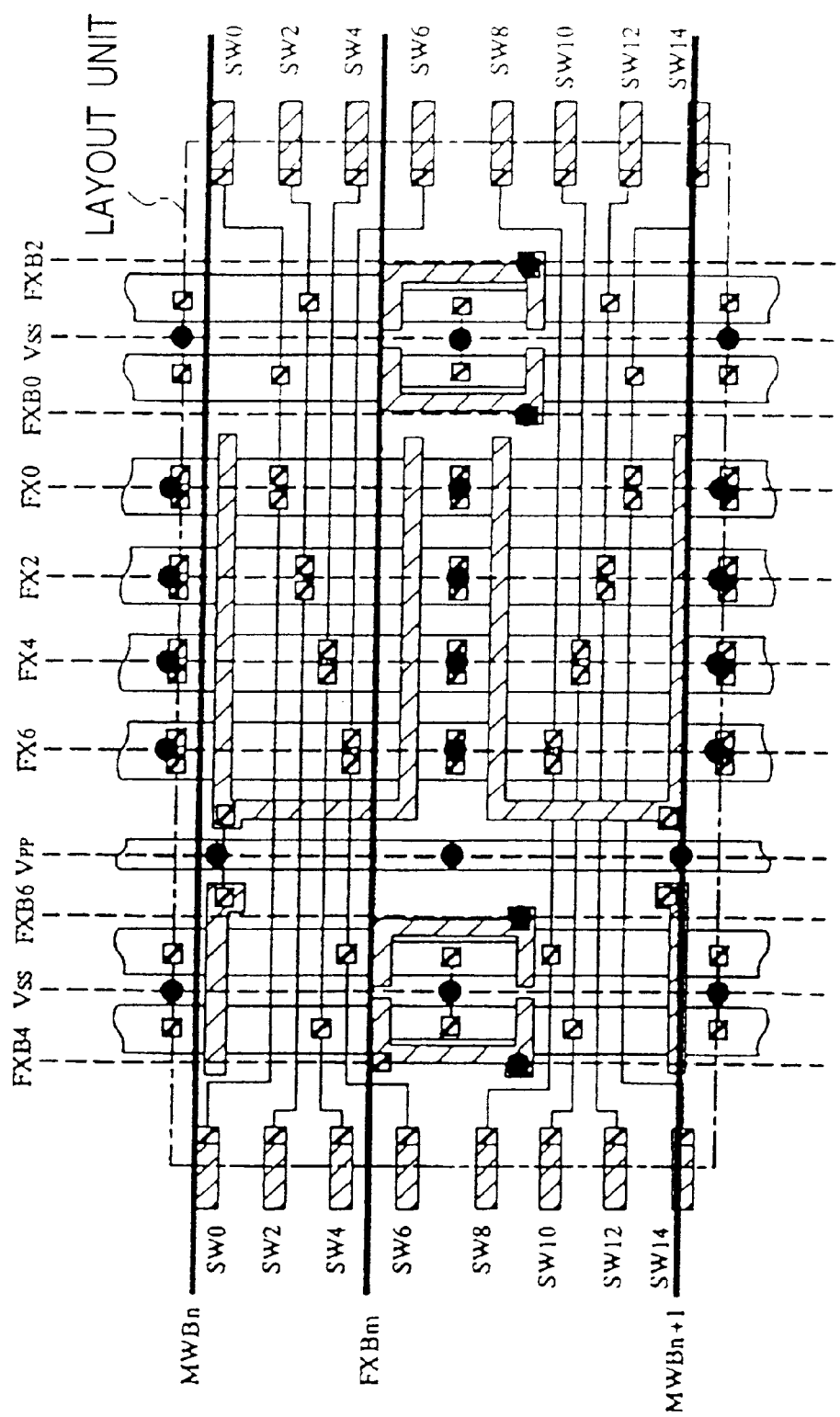
Figure 8:
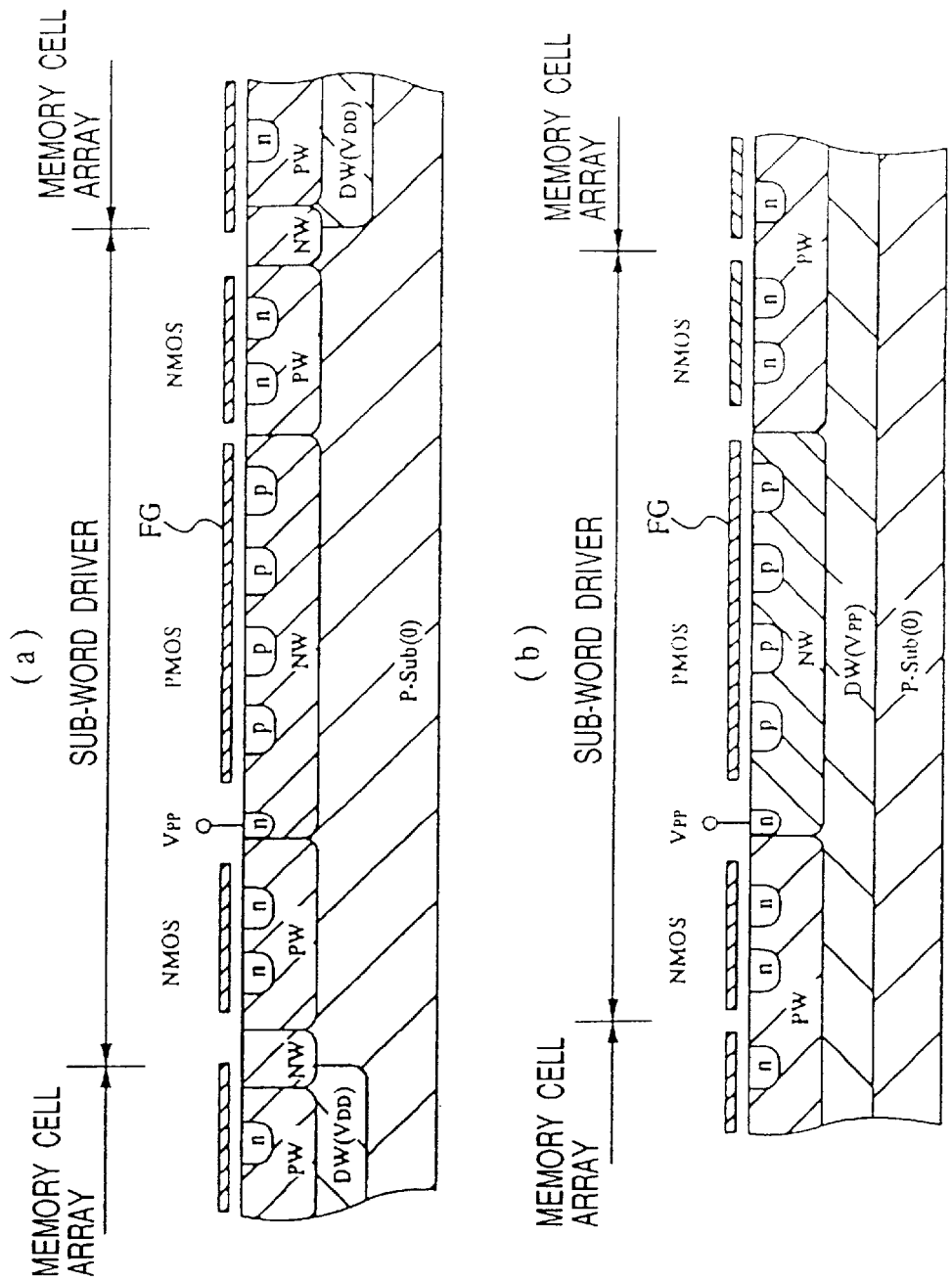

FIGS. 6 through 8 are circuit diagrams of the sub-word driver and plan and section views of the layout, wherein the circuit diagram in FIG. 6 shows four sub-word line segments, and the section view in FIG. 8 shows a sectional structural view of the part under a gate with respect to the plan view of FIG. 7.

In FIG. 7, a layout unit surrounded by a dotted chain line corresponds to the Unit 1 in FIG. 5. The reference symbols (MWBn) and (MWBn+1) denote the main word lines and (FXBm) denotes the pre-decoder line. Specifically, in the present invention, the sub-word driver for the redundant memory cell may be obtained by replacing the normal main word line MWBn or MWBn+1 by the redundant main word line RMWB.

The sub-word driver comprises one PMOS transistor and two NMOS transistors, as shown in FIG. 6 for example. When the main word line MWB is Low, the pre-decoder line FXB is Low, and the pre-decoder line FX is High, the sub-word line SW is put into the state of selecting High level (VPP). The pre-decoder lines FXB and FX are always required to have a complementary potential relationship in the sub-word driver of this scheme.

In the layout of the sub-word driver, while eight sub-word lines SW0 through SW14 (even Nos.) are outputted as shown in FIG. 7, eight sub-word lines SWI through SW15 (odd Nos.) are wired from the adjacent sub-word drivers on the right and left which are not shown, so that 16 sub-word lines SW0 through SW15 in total are disposed in the longitudinal dimension in the figure.

A main word line MWB in a metal 2 layer M2 and a sub-word line SW in a metal 1 layer M1 run in the transverse direction in FIG. 7, and a pre-decoder line FX of a metal 3 layer M3 and power lines (VPP and VSS) are disposed in the vertical direction. A source/drain within the sub-word driver is taken out by the metal 1 layer M1. Two metal layers may be used (but not three), when a bit line layer is used for connecting the devices. The output of the sub-word line is transformed from the metal I layer M1 to a gate layer FG to be sent to the memory cell array 15 at both the right and left ends of the sub-word driver Further, the sub-word driver is flown on a P-type semiconductor substrate P-Sub, as shown in the section view of the sub-word driver in FIG. 8. FIG. 8(a) shows a DWELL isolating structure, and FIG. 8(b) shows a DWELL non-isolating structure. The triple well structure of FIG. 8(a) requires an isolating region at the boundary of the memory cell array 15 and the sub-word driver. The voltage VPP is applied to an N-well region NW of the sub-word driver, 0 V is applied to a P-well region PW of the NMOS, similarly to the P-Sub, and negative voltage VBB is applied to a P-well PW of the memory cell array 15. The triple-well structure of FIG. 8(b) requires no isolating region because the memory cell array 15 and the sub-word driver are formed on the DW. Negative voltage VBB is applied to the PW of the sub-word driver and the memory cell array 15.

The triple-well structure of the memory cell array 15 is widely used in DRAMs of 64 M-bits and thereafter as means for preventing noise from the peripheral circuits, such as the sub-word driver and the sense amplifier to the memory cell, for enhancing the performance of the MOS transistor (a short channel MOS may be utilized because a well-bias of P well of the peripheral circuit is 0 V), and for strengthening the electrostatic protection by applying 0 V to the Sub.

Figure 9:
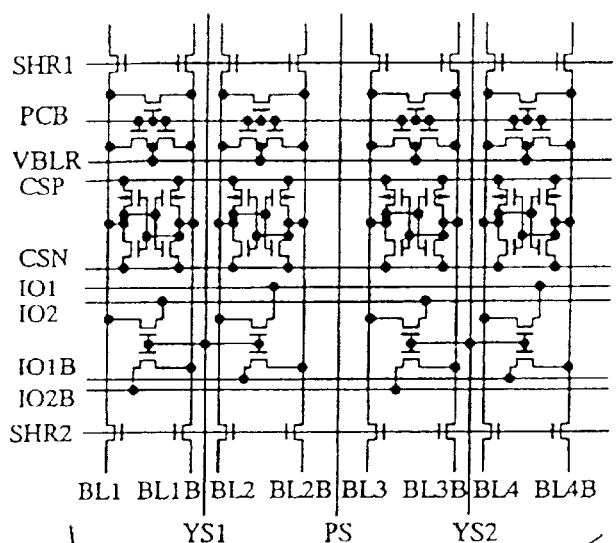
FIGS. 9(a) and 9(b) are respectively, a circuit diagram and a layout showing sense amplifiers.
Figure 9:
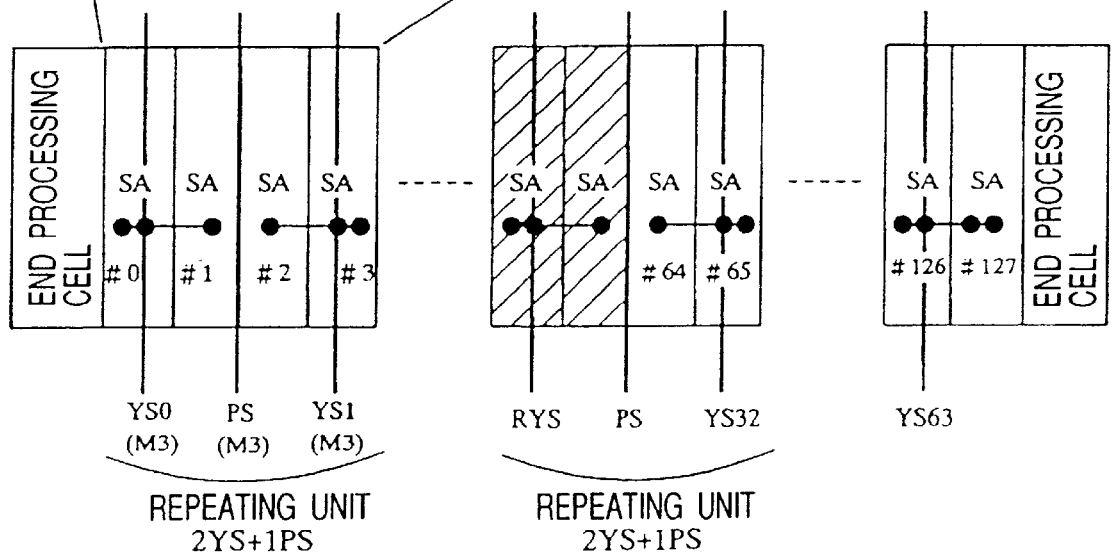
Figure 10:
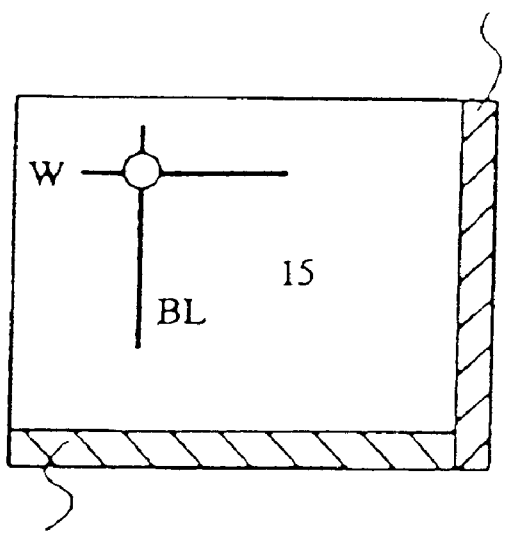
FIGS. 10(a) and 10(b) are layouts showing a memory cell array and direct peripheral circuits in a semiconductor memory which is the premise of the present invention.
Figure 10:
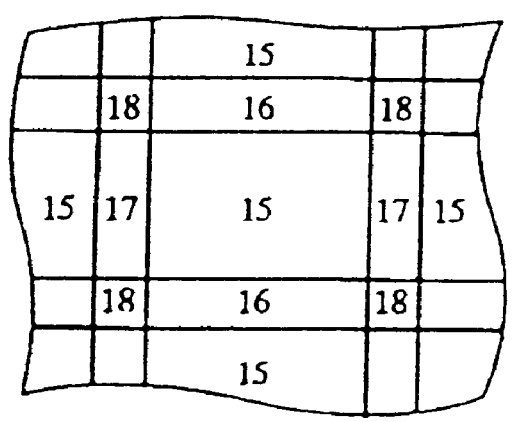

FIGS. 9(a) and 9(b) are a circuit diagram and a layout of the sense amplifier, to which the concept of the invention outlined in FIG. 3 and FIG. 4 is applied.

A shared scheme of sharing sense amplifiers among the neighboring memory cells is adopted for this sense amplifier, as shown in FIG. 9(a). In amplifying signals, a signal of a shared line SHR on the non-rejected memory cell on the selected memory cell is changed to the voltage VPP, and a signal of a shared sense amplifier isolating signal line SHR is changed to 0 V in order to isolate the bit lines BL and BLB from the sense amplifier by a cut MOS transistor. The reference symbol PCB denotes a bit line pre-charging signal line, VBLR denotes bit line pre-charging voltage, CSP and CSN denote sense amplifier driving lines, and Io1, I02, I01B and I02B denote IO lines or actually local IO lines. As for the layout of the sense amplifier, four sense amplifiers SA are set as a basic repeating unit (Unit 1) of the layout, as shown in FIG. 9(b). It includes two column selecting signal lines YS, one power line or signal line PS, and three signal lines of the metal 3 layer M3. Although the column selecting signal line YS is used in the sense amplifier SA, the power line or the signal line PS merely passes above the sense amplifier. One column selecting signal line YS controls two sense amplifiers SA. The three lines of the metal 3 layer M3 are disposed within the width of the four sense amplifiers SA. Accordingly, it is appropriate to set the four sense amplifiers SA as one layout unit.

When there are two sense amplifiers SA for the redundant memory cell at the center, one column selecting signal line YS is replaced with a redundant column selecting signal line RYS, while maintaining the same repetition by combining two sense amplifiers SA, for the redundant memory cell and two normal sense amplifiers SA as shown in the figure. When the hatched part is to be specially laid out, the mutual relationship among the metal 3 layers M3 collapses and the space of the metal 3 layer M3 becomes insufficient. Then, the layout (Unit 2) of the sense amplifier SA of the width is added at the end for the increase of the redundant sense amplifier SA. It is not difficult to add this because it is added at the end.

Therefore, since the semiconductor memory of the present embodiment allows the redundant memory cell to be disposed almost at the center of the memory cell array 15 and the direct peripheral circuits, such as the sub-word driver and the sense amplifier adjacent to the memory cell array 15 to be disposed while maintaining the normal repeating unit, it allows the quality of the redundant memory cell to be improved and the production yield of the memory cell array 15 and the direct peripheral circuits to be improved.

Although the invention devised by the inventor has been explained specifically based on the embodiments thereof, the invention is not limited to the embodiments described above and may be modified variously within the scope of the gist.

As described above, the inventive semiconductor memory is useful for a highly integrated semiconductor memory and for a semiconductor memory of 64 M-bits, 256 M-bits DRAM, or synchronous DRAM, in which the invention is effectively applied for the disposition of the redundant memory cell, the layout of the word driver and the sense amplifier connected to the redundant memory cell. Still more, it is widely applicable to other highly integrated DRAMs and other semiconductor memories, such as SRAM, RAM, ROM, PROM, EPROM and EEPROM.

What is claimed:

1. A semiconductor memory comprising:

a plurality of first word lines extending in a first direction in a memory cell array;

a plurality of second word lines extending in said first direction in said memory cell array;

a plurality of third word lines provided between said first word lines and said second word lines in said memory cell array;

a first drive circuit connected to said first word lines;

a second drive circuit connected to said second word lines;

a third drive circuit connected to said third word lines;

a plurality of first bit lines extending in a second direction crossing said first direction in said memory cell array;

a plurality of second bit lines extending in said second direction in said memory cell array;

a plurality of third bit lines provided between said first bit lines and said second bit lines in said memory cell array;

a first sense circuit connected to said first bit lines;

a second sense circuit connected to said second bit lines; and a third sense circuit connected to said third bit lines, wherein each of said first, second and third drive circuits is a unit having a common layout, wherein said first and second word lines are normal word lines, wherein some of said third word lines are redundant word lines and the others of said third word lines are normal word lines, wherein each of said first, second and third sense circuits is a unit having a common layout, wherein said first and second bit lines are normal bit lines, and wherein some of said third bit lines are redundant bit lines and the others of said third bit lines are normal bit lines.

2. A semiconductor memory according to claim 1, wherein said memory cell array is formed in a first rectangular region on a semiconductor substrate, wherein said first, second and third drivers are formed in a second rectangular region on said semiconductor substrate, and wherein said first, second and third sense circuits are formed in a third rectangular region on said semiconductor substrate.

* * * * *